FREQUENCY SYNTHESIZER

Filed Aug. 23, 1965

INVENTOR
GEORGE EDWARD STRICKHOLM
BY
ATTORNEY

United States Patent Office 3,331,035
Patented July 11, 1967

3,331,035
FREQUENCY SYNTHESIZER

George Edward Strickholm, Lincoln, Vt., assignor to Sanders Associates, Inc., Nashua, N.H., a corporation of Delaware Filed Aug. 23, 1965, Ser. No. 534,544
15 Claims. (Cl. 331—178)

Figures 1, 2:
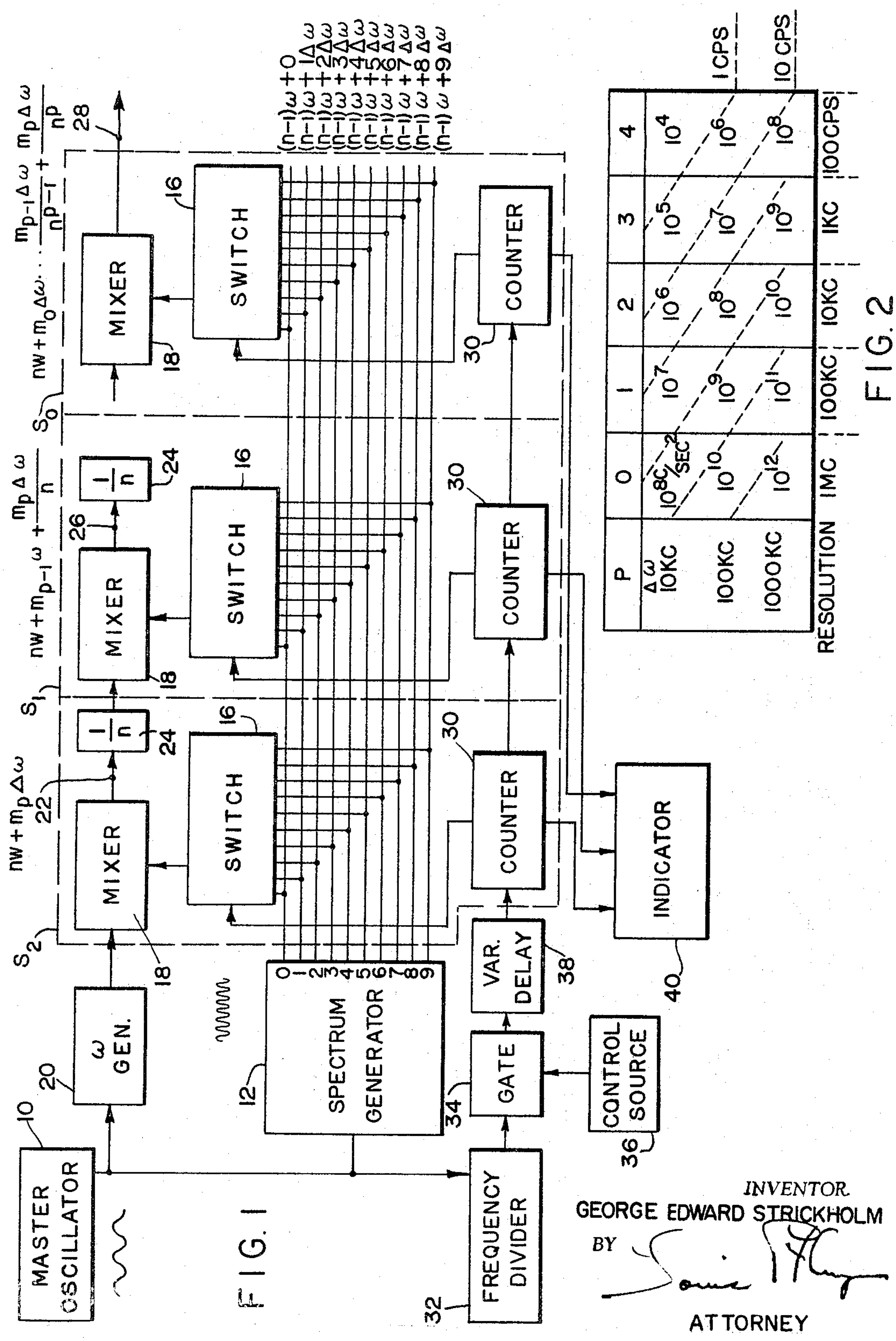

This invention relates to a frequency synthesizer capable of switching rapidly in discrete frequency steps over a wide frequency range with minimal production of switching transients in the output. The synthesizer provides instantaneous frequency information and may be constructed with any desired resolution.

A frequency synthesizer is a device for selectively combining a plurality of input frequencies derived from a common source to produce an output signal which is adjustable over a given frequency range. Sweeping the synthesizer involves switching from one set of input frequencies to another to obtain the desired output frequency. Such synthesizers have many varied applications. For example, they are used as variable frequency generators and as controlled local oscillators for receivers. They are also employed in programmable frequency applications. Thus, they may be used to provide coded frequency shifts in secure communications devices.

One type of sweep frequency source has a continuously adjustable output and therfore, it can ideally be set to any desired frequency in its range of operation. However, it has limited accuracy because it must employ analog methods or time-consuming measurement techniques to indicate frequency at any given time.

The second type of sweep frequency source which is potentially more accurate has an output frequency that is controlled in discrete steps. Accuracy results from the fact that the output frequency is synthesized from a number of fixed, stable input frequencies. However, this type of sweep frequency source has suffered because the stepwise transition between frequencies has given rise to undesirable transients or disturbances in the output signal.

This invention pertains to the second type of sweep frequency source. It overcomes the aforementioned problem of transients in the output signal by proper selection of the time of switching from one output frequency to another.

Thus, it is the primary object of this invention to provide a swept frequency synthesizer whose output signal changes in discrete frequency steps and yet contains minimal switching transients.

Another object of the invention is to provide such a synthesizer having linear frequency sweep.

A still further object of the invention is to provide a frequency synthesizer of the above type which gives instantaneous frequency information with a high degree of accuracy.

Another object of the invention is to provide a synthesizer of the above type having a high sweep rate with fine frequency resolution.

Another object of this invention is to provide a method of sweeping a frequency synthesizer so as to produce minimal switching transients in the synthesizer output signal.

The invention accordingly comprises the several steps and the relation of one or more such steps with respect to each of the others and the apparatus embodying features of construction, combination of elements and arrangement of parts which are adapted to effect such steps, all as exemplified in the following detailed disclosure, and the scope of the invention will be indicated in the claims.

For a fuller understanding of the nature and objects of the invention, reference should be had to the following detailed description taken in connection with the accompanying drawing, in which:

FIG. 1 is a block diagram of a swept frequency synthesizer embodying the principles of this invention, and FIG. 2 is a table showing frequency resolution and sweep speeds for various multiple stage synthesizers made in accordance with this invention.

In general, a synthesizer embodying the invention derives a spectrum of discrete frequencies which are harmonics of a basic clock frequency. It switches between these frequencies to obtain a range of output frequencies. The switching from one frequency to another is controlled by the same clock source to take place when the two signals have equal instantaneous phase and magnitude. This condition is met most easily when switching occurs at the zero axis crossing of the signals. The maintenance of such control over the switching operation eliminates phase reversals or discontinuities and provides minimum energy losses at the time of switching. Hence, it greatly reduces the transient components in the output signal of the synthesizer.

The basic synthesizer unit is preferably employed in a decade system having a plurality of stages. Each stage reflects one significant figure of the frequency of the output signal from the synthesizer, and the number of stages in the synthesizer determines the frequency resolution thereof. The output frequency of the synthesizer is changed by switching from one clock frequency harmonic to another as aforesaid in one or more stages of the synthesizer.

Referring now to FIG. 1 of the drawing, the synthesizer includes a master oscillator 10 having a frequency $\Delta\omega$ and generating a sinusoidal output signal. The output signal from oscillator 10 is fed to a spectrum generator 12 which provides a plurality of output signals harmonically related to the clock frequency. Specifically, at terminals 0 to $n$, a generator 12 has outputs at the respective frequencies $(n-1)\omega+0$, $(n-1)\omega+\Delta\omega$, $$(n-1)\omega+2\Delta\omega \ldots (n-1)\omega+(n-1)\Delta\omega$$

where $\omega$ is a harmonic of $\Delta\omega$.

Illustratively, the spectrum generator includes a harmonic generator, e.g., a pulse generator keyed by the oscillator 10, followed by a bank of $n$ filters tuned to the respective output frequencies of the generator. Amplifiers may also be included to provide a suitable signal level at the generator output.

For purposes of illustration, we have shown a decade system in which $n=10$, spectrum generator 12 then having ten separate output terminals, 0 to 9, delivering ten separate frequencies, i.e. $9\omega+0$, $9\omega+\Delta\omega$, $9\omega+2\Delta\omega \ldots 9\omega+9\Delta\omega$. These ten signals are all synchronized with the same master oscillator 10, and all have the same phase delay in the spectrum generator 12.

The ten output signals from the spectrum generator 12 are applied to one or more similar switching stages indicated generally at $S_2$, $S_1$, and $S_0$ in the illustrated three stage system. In each stage a switch 16 receives the generator 12 signals, and delivers a selected one to a mixer 18. The frequency selected by each switch 16 is given by $\omega_p=(n-1)\omega+m_p\Delta\omega$, where $m$ is a number from 0 to 9, corresponding to the position of the associated switch 16, i.e., the particular output terminal of the spectrum generator 12 selected by means of the switch. In the illustrated synthesizer, the subscript $p$ is a number from 0 to 2 designating a particular stage $S_0$ to $S_2$. Thus, in the stage $S_2$, the frequency selected by the switch 16 therein in the decade system is given by $$\omega_2=9\omega+m_2\Delta\omega$$

In each mixer 18, the frequency selected is mixed with another incoming frequency, with the sum of these two frequencies being selected in the output of the mixer.

More specifically, in the case of the first stage $S_2$, the selected frequency $\omega_2$ is mixed with the frequency $\omega$ supplied by a generator 20. Generator 20 is also keyed by the oscillator 10. The output of the mixer 18 in the stage $S_2$, appearing at point 22, comprises the sum of its two input frequencies, i.e., $10\omega+m_2\Delta\omega$. This signal is delivered via a frequency divider 24 to the next synthesizer stage $S_1$. The frequency divider 24 divides its input frequency by $n$, i.e., by 10 in the illustrated decade system, and the output of the divider 24 in the stage $S_2$ thus has the frequency $\omega+m_2\Delta\omega/10$.

The output of the first synthesizer stage $S_2$ is combined in the stage $S_1$ mixer 18 with the frequency $\omega_1=9\omega+m_1\Delta\omega$, selected from spectrum generator 12 by the switch 16 in this stage. The output of the second stage mixer 18, appearing at the point 26, thus has the frequency $$10\omega+m_1\Delta\omega+m_2\Delta\omega/10$$

As before, this signal is applied to a frequency divider 24 for divisin by 10, the output frequency of the divider 24 in the stage $S_1$ thus being $\omega+m_1\Delta\omega/10+m_2\Delta\omega/100$.

In the final stage $S_0$, the frequency $\omega_0=9\omega+m_0\Delta\omega$, selected by switch 16 in that stage is mixed in a mixer 18 with the aforementioned output of the stage $S_1$. The output of the final stage mixer 18, appearing at terminal 28, is therefore $$10\omega+m_0\Delta\omega+m_1\Delta\omega/10+m_2\Delta\omega/100$$

This is a decimal representation of the synthesizer output frequency, with the first, second and third significant digits, corresponding to $m_2$, $m_1$ and $m_0$, respectively, being in accordance with the settings of the switches 16 in the stages $S_2$, $S_1$, and $S_0$.

In the general case involving $p$ stages, the output frequency is given by $$n\omega+m_0\Delta\omega+\frac{m_1\Delta\omega}{n}+\frac{m_2\Delta\omega}{n^2}+\dots$$

$$\frac{m_p-1\Delta\omega}{n^{p-1}}+\frac{m_p\Delta\omega}{n^p}$$

Thus with each additional stage, the resolution of the output frequency at the terminal 28 is increased a factor of $n$.

The illustrated synthesizer is provided with an automatic frequency stepping system which sweeps the synthesizer through its range of output frequencies. For this purpose, each of the switches 16 is preferably an electronic switch controlled by a counter 30 in the same stage. Specifically, each counter counts from 0 to 9 and the position of each switch 16 depends on the content of the counter connected thereto. For example, if the content of a counter is 3, the switch 16 controlled thereby will pass the frequency from the number 3 terminal of the spectrum generator 12 to the mixer 18 connected to the switch.

The counter 30 in the stage $S_2$ counts pulses from a frequency divider 32 whose input signal is the output of the master oscillator 10. A gate 34 interposed between the divider 32 and the counter 30 of the stage $S_2$ is controlled by a control source 36. In the illustrated synthesizer, a variable delay 38 is included between gate 34 and the counter 30 in stage $S_2$ to facilitate initial synchronization of the switching pulses and the harmonically related input signals applied to stage $S_2$.

During the initial operation of the synthesizer, assume that the counters 30 are all set to zero, so that in the illustrated three-stage decade system, $m_2$, $m_1$ and $m_0$ are all zero. The output frequency appearing at terminal 28 is, therefore, $10\omega$. If the gate 34 is then opened to pass pulses to the counter 30 of the stage $S_2$, the count in this counter will begin advancing. As it does so, the switch 16 in stage $S_2$ will step through the consecutive output terminals 0–9 of the spectrum generator 12. This will cause the output frequency of the system, appearing at terminal 28, to advance in increments of $$\frac{\Delta\omega}{100}$$

i.e., through $$10\omega,\ 10\omega+\frac{\Delta\omega}{100},\ 10\omega+\frac{2\Delta\omega}{100},\ 10\omega+\frac{3\Delta\omega}{100}\ \dots$$

When the first counter 30 reaches the count of 9, the next pulse from the divider 32 will caues it to reset to zero and at the same time emit a pulse to the counter 30 in the next stage $S_1$. The application of the pulse to counter 30 in stage $S_1$, will cause the swtich 16 in that stage to connect the mixer 18 in that stage to the number 1 terminal of the spectrum generator 12. The output frequency at terminal 28 will therefore become $$10\omega+\frac{\Delta\omega}{10}$$

The counter 30 in the stage $S_2$ will continue to count pulses from the divider 32 and thus the switch 16 in the same stage will continue to cycle through the ten positions of the spectrum generator 12. The synthesizer output frequency therefore continues to advance in increments of $$\frac{\omega}{100},\ \text{i.e., } 10\omega+\frac{\Delta\omega}{10},\ 10\omega+\frac{\Delta\omega}{10}+\frac{\Delta\omega}{100},\ 10\omega+\frac{\Delta\omega}{10}+\frac{2\Delta\omega}{100}\ \dots$$

Each time the counter 30 in stage $S_2$ reaches a count of 9, the next input pulse thereto will cause the counter 30 in the next stage $S_1$ to add a count to its content, with a resulting indexing of the switch 16 in stage $S_1$. Similarly, each time the counter 30 in the stage $S_1$ reaches the count of 9, its next input pulse will cause it to return to zero and apply a pulse to the counter 30 in the last stage $S_0$. This causes the switch 16 in the stage $S_0$ to index to the next output terminal in the spectrum generator 12. Further pulses from divider 32 will cycle the sythesizer in increments of $$\frac{\Delta\omega}{100}$$

until the output frequency at terminal 28 reaches $$10\omega+\frac{9\Delta\omega}{10}+\frac{9\Delta\omega}{100}$$

The next pulse will return the synthesizer output frequency to the initial value $10\omega$.

The contents of the counters 30 may be applied to an indicator 40 which displays them and thereby registers the output frequency of the synthesizer. In the illustrated system, the first stage $S_2$ provides the least significant figure and the last stage $S_0$ provides the most significant figure in the frequency indication on indicator 40. When pulses from the divider 32 cease upon command from control source 36, the output frequency at terminal 28 stays at a particular value which will be indicated by indicator 40, until the resumption of pulses from the divider 32.

As pointed out above, it is desirable that the indexing of each switch 16 from one terminal of the spectrum generator 12 to the next terminal be accompanied by a minimum of frequency transients. With the present invention, this is accomplished by synchronizing the switching operation with the sinuosidal output of master oscillator 10.

More particularly, the keying of spectrum generator 12 by the output signal of oscillator 10 results in generator 12 output signals which are synchronized to the oscillator 10 output. Thus, the outputs of the generator 12 are also in synchronism with each other. Specifically, they all have a zero axis crossing corresponding to each zero axis crossing of the oscillator 10 signal. Assuming the same delay in the generator 12 for all of its output signals, these zero axis crossings associated with the oscillator axis crossings will all occur at the same time.

As described previously, the signals from oscillator 10 also control the actuation of switches 16 in the various synthesizer stages. By proper adjustment of variable delay 38, the pulses from frequency divider 32, whose input signal is the oscillator 10 output signal, are made to actuate switches 16 only when the harmonic components at the output terminals 0–9 of the spectrum generator 12 have the same instantaneous phase and magnitude. This is most easily accomplished at times corresponding to the zero axis crossings of the oscillator 10, i.e., taking into account delays in the generator 12, frequency divider 32, delay 38 and counter 30. It will be apparent that axis crossings of the generator 12 output signals may also correspond to crossings of harmonics of the basic frequency $\Delta\omega$. Moreover, by adjusting the relative phases of the generator 12 outputs and controlling their relative amplitudes, the equal phase and magnitude condition can be made to occur at a point other than a zero axis crossing.

Accordingly, when switches 16 switch between the output terminals of spectrum generator 12, there are no rapid phase reversals or changes in magnitude in the outputs of the switches. Frequency transients in the switch outputs are thus minimized with consequent minimizing of transients in the output of the synthesizer as a whole.

In the general case, a synthesizer having $p$ stages can sweep at a rate $\omega^2/n^p$. The frequency resolution of such a synthesizer may be expressed as $$\frac{\Delta\omega}{n^p}$$

Thus, for example, the illustrated synthesizer having an oscillator 10 frequency of 100 k.c. and three stages ($p$=2) can sweep through its range of output frequencies in 1 kc. steps. The synthesizer has a sweep rate of $$\frac{100\text{ mc.}}{\text{sec.}^2}$$

FIG. 2 is a table showing the synthesizer sweep rates in cycles/sec.$^2$ and frequency resolutions for various combinations of oscillator 10 frequencies and numbers of stages. It is seen that the synthesizer is capable of high sweep rates and also that by increasing the number of stages in the synthesizer the frequency resolution can be increased substantially.

Thus, I have shown that my improved swept frequency synthesizer has an output whose frequency can be swept rapidly in small, discrete frequency steps.

Through proper selection of the time of switching from one output frequency to another, switching transients in the output signal are kept to a minimum. As a result, the synthesizer is able to provide very accurate frequency information very quickly.

While in the illustrated embodiment we have shown an automatic sweep arrangement, it will be apparent that the counters 30 and switches 16 can be connected to switch between non-consecutive frequencies, i.e., between any two outputs from the spectrum generator 12. In this way, the synthesizer can be employed in various programmable frequency applications.

It will thus be seen that the objects set forth above, among those made apparent from the preceding description, are efficiently attained, and, since certain changes may be made in carrying out the above method and the construction set forth without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Having described the invention, what is claimed as new and secured by Letters Patent is:

I claim:

1. A method of generating a spectrum frequencies one after another, said method comprising the steps of:
(A) deriving a plurality of signals having frequencies which are harmonically related to and in synchronism with a basic frequency signal,
(B) switching the frequencies in turn to an output circuit,
(C) synchronizing said switching with said basic frequency signal so that switching between two signals occurs when they have equal instantaneous phase and magnitude.

2. A frequency synthesizer comprising:
(A) signal generating means providing at least two harmonically related signals,
(B) an output circuit,
(C) switch means connected between said signal generating means and said output circuit, said switch means being adapted to switch one of said signals after the other to said output circuit, and
(D) means for synchronizing the switching of said switch means with said two signals to occur when said two signals have equal instantaneous phase and magnitude.

3. A frequency synthesizer as defined in claim 2
(A) including:
  (1) a succession of said switch means and
  (2) a corresponding succession of frequency changing means,
  (3) each switch means being connected between said signal generating means and its corresponding frequency changing means with said synchronizing means controlling the switching of each said switch means, and
(B) further including means interconnecting successive frequency changing means, whereby the output frequency of each frequency changing means is a function of both the position of its corresponding switch means and the output frequency of the preceding frequency changing means.

4. A frequency synthesizer as defined in claim 3 wherein
(A) each frequency changing means includes a mixer having as its inputs
  (1) the output frequency of the corresponding switch means, and
  (2) the output frequency of the preceding frequency changing means,
(B) all but the last frequency changing means includes a frequency divider for dividing the output of its mixer prior to delivery to the next succeeding mixer.

5. A frequency synthesizer comprising:
(A) signal generating means having a plurality of output ports,
(B) synchronizing means for controlling said generating means to produce synchronized and harmonically related signals at said output ports,
(C) a first switching stage and at least one further switching stage, each switching stage including
  (1) a multiple position switch, and
  (2) frequency changing means, said switch in each stage being connected between said plurality of ports, and said frequency changing means of said stage,
(D) means interconnecting successive frequency changing means so that
  (1) said frequency changing means in said first stage is first in the succession, and
  (2) the output of each frequency changing means in each further stage is a function of the position of the switch in the same stage and the output of the preceding frequency changing means, (E) circuit means interconnecting said synchronizing means and said switch in each said stage whereby the operation of each said switch is synchronized by said synchronizing means with the production of said harmonically related signals.

6. A frequency synthesizer as defined in claim 5 wherein said frequency changing means in each further stage includes a mixer whose output frequency is the resultant of (A) the signal frequency at the output port selected by said switch in the same stage, and (B) the output frequency of the preceding frequency changing means.

7. A frequency synthesizer as defined in claim 6 including (A) second signal generating means whose output is an input of the mixer in said first stage.

8. A frequency synthesizer as defined in claim 6 wherein each means interconnecting successive frequency changing means includes a frequency divider for dividing the output frequency of each mixer prior to its delivery to the mixer in the next succeeding stage.

9. A frequency synthesizer as defined in claim 8 wherein each said frequency divider divides the output frequency of the corresponding mixer by a number corresponding to the number of ports in said frequency generating means.

10. A frequency synthesizer as defined in claim 9 wherein said frequency generating means has ten ports.

11. A frequency synthesizer as defined in claim 5 wherein each switching stage includes:

(A) a counter whose content determines the position of the switch in that stage, (B) means for connecting said synchronizing means to the counter in said first stage, (C) means for interconnecting said counters whereby each counter emits a signal to the next succeeding counter for advancing its content each time the first mentioned counter completes a counting cycle.

12. A frequency synthesizer as defined in claim 11 including an indicator connected to each of said counters for indicating the contents thereof.

13. A frequency synthesizer as defined in claim 11 wherein each said synchronizing means includes:

(A) a frequency divider, (B) a gate connected in series in the input line to said counter in said first stage, and (C) means for controlling said gate.

14. A frequency synthesizer comprising:

(A) a signal generating means having a plurality of output ports, (B) an oscillator for controlling said signal generating means to produce a plurality of synchronized and harmonically related signals at said ports, (C) a plurality of switching stages, each stage including:

(1) a mixer, and (2) a multiple position switch connected between said signal generating means and the mixer in the same stage, (D) frequency dividers connected between successive mixers for dividing the output frequency of each mixer prior to its delivery to the next succeeding mixer, the mixer in each stage thereby having as its input signals the output of the switch in the same stage and the divided output frequency of the preceding mixer, (E) each stage also including a counter whose content determines the position of the switch in that stage, (F) means for feeding signals from said oscillator to the counter in said first stage for advancing the count in said counter, and (G) means interconnecting said counters whereby each said counter feeds a signal to the counter in the next succeeding stage for advancing its count and switching its corresponding switch whenever the first mentioned counter completes a counting cycle and whereby the switching operation in each stage is synchronized by said oscillator with the production of signals at said ports.

15. A frequency synthesizer comprising:

(A) a first signal generator means having ten output ports, (B) an oscillator for controlling said signal generating means to produce ten synchronized and harmonically related signals at said ports, (C) a first switching stage and a plurality of successive switching stages, each stage including:

(1) a mixer, and (2) a switch having ten positions corresponding to the said ten ports and connected between said ports and the mixer in the same stage.

(D) a frequency divider connected between the mixers of successive stages, each said frequency divider dividing the output frequency of the preceding mixer by ten, (E) a second signal generator connected to the mixer in said first stage, (F) each stage also including a decade counter whose content determines the position of the switch in that stage, (G) means for feeding signals from said oscillator to the counter in said first stage for advancing the count in said counter, said means including:

(1) a frequency divider for dividing the frequency of said oscillator, (2) delay means for synchronizing the pulses from said oscillator with the signals at said ports, (3) a gate connected between said frequency divider and (4) means for controlling said gate whereby pulses from said oscillator are controlledly fed to the counter in said first stage at a rate less than the lowest frequency produced by said first signal generator, (H) means interconnecting said counters whereby each of said counters feeds a signal from said oscillator to the counter in the next succeeding stage for advancing its content whenever the first mentioned counter completes a counting cycle.

No references cited.

ROY LAKE, *Primary Examiner.*

J. KOMINSKI, *Assistant Examiner.*